United States Patent
Mayer et al.

(10) Patent No.: US 6,739,496 B2
(45) Date of Patent: May 25, 2004

(54) METHOD FOR THE CALIBRATION OF A WIRE BONDER

(75) Inventors: Michael Mayer, Neuheim (CH); Martin Melzer, Steinhausen (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 10/357,160

(22) Filed: Feb. 3, 2003

(65) Prior Publication Data

US 2003/0146267 A1 Aug. 7, 2003

(30) Foreign Application Priority Data

Feb. 1, 2002 (CH) ............................. 0188/02

(51) Int. Cl.⁷ ............................. B23K 31/02; B23K 1/06
(52) U.S. Cl. ................. 228/180.5; 228/102; 228/110.1
(58) Field of Search ............................. 228/102, 180.5, 228/212, 4.5, 44.7, 1.1, 55, 103, 110.1; 156/73.2, 73.1, 580.1; 257/48

(56) References Cited

U.S. PATENT DOCUMENTS

| | | | |
|---|---|---|---|
| 5,199,630 A | | 4/1993 | Felber et al. |
| 5,377,894 A | | 1/1995 | Mizoguchi et al. |
| 6,112,972 A | * | 9/2000 | Koduri ..................... 228/180.5 |
| 6,215,195 B1 | * | 4/2001 | Koduri ........................ 257/784 |
| 6,447,162 B2 | * | 9/2002 | Clyne .......................... 374/137 |
| 6,648,205 B2 | * | 11/2003 | Mayer et al. ................ 228/102 |
| 2001/0045443 A1 | | 11/2001 | Miller et al. |

OTHER PUBLICATIONS

Schwizer, Mayer, Brand, Baltes: "Analysis of Ultrasonic Wire Bonding by In-situ Piezoresistive Microsensors"; The 11th International Conference on Solid-State Sensors and Actuators, pp. 1426–1429, Transducers '01—Eurosensors XV, Munich, Germany, Jun. 10–14, 2001.

* cited by examiner

Primary Examiner—Kiley Stoner
Assistant Examiner—Jonathan Johnson
(74) Attorney, Agent, or Firm—McCormick, Paulding & Huber LLP

(57) ABSTRACT

In order that, on wire bonding by means of a Wire Bonder, optimum bonding results can be achieved after a capillary change it is suggested that, after a change from a first capillary to a second capillary, the ultrasonic transducer which applies ultrasonics to the horn which guides the capillary is controlled with a parameter $P_2$ which results from the parameter $P_1$ before the capillary change as $P_2 = g(k_1, k_2)*P_1$ or $P_2 = g(k_1, k_2, A_1, A_2)*P_1$ or $P_2 = g(k_1, k_2, A_1, A_2, H_1, H_2)*P_1$, whereby the quantities $k_1$ and $k_2$ designate the estimated values for the flexural strength, the quantities $A_1$ and $A_2$ the amplitudes of the freely oscillating capillary and $H_1$ and $H_2$ the diameters in the narrowest part of the longitudinal drill hole of the first or second capillary and whereby the function g is a predetermined function.

18 Claims, 3 Drawing Sheets

METHOD FOR THE CALIBRATION OF A WIRE BONDER

PRIORITY CLAIM

Figure 1:
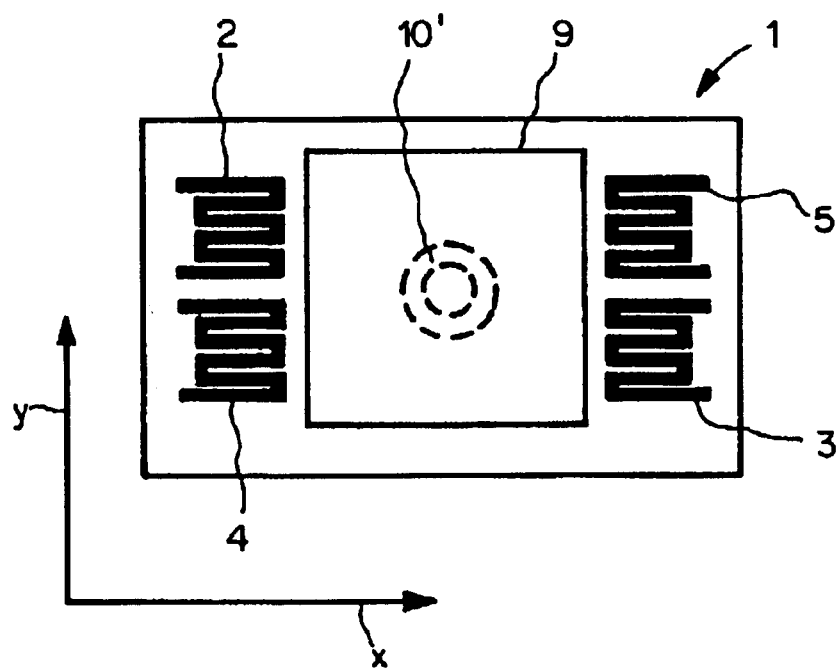

The present application claims priority under 35 U.S.C §119 based upon Swiss Patent Application No. 2002 0188/02 filed on Feb. 1, 2002 which is incorporated herein by reference.

FIELD OF THE INVENTION

The invention concerns a method for the calibration of a Wire Bonder.

BACKGROUND OF THE INVENTION

A Wire Bonder is a machine with which wire connections are made to semiconductor chips after they have been mounted on a substrate. The Wire Bonder has a capillary which is clamped to the tip of a horn. The capillary serves to secure the wire to a connection point on the semiconductor chip and to a connection point on the substrate as well as to guide the wire between the two connection points. On making the wire connection between the connection point on the semiconductor chip and the connection point on the substrate, the end of the wire protruding from the capillary is first melted into a ball. Afterwards, the wire ball is secured to the connection point on the semiconductor chip by means of pressure and ultrasonics. In doing so, ultrasonics are applied to the horn from an ultrasonic transducer. This process is known as ball bonding. The wire is then pulled through to the required length, formed into a wire loop and welded to the connection point on the substrate. This last process is known as wedge bonding. After securing the wire to the connection point on the substrate, the wire is torn off and the next bond cycle can begin.

The ball bonding is influenced by various factors. In order to achieve bond connections of a predetermined quality, the adequate values of several physical and/or technical parameters must be determined for a particular process. Examples of such parameters are the bond force, that is the force which the capillary exerts on the ball or the connection point of the semiconductor chip during the bonding process, or the amplitude of the alternating current which is applied to the ultrasonic transducer of the horn.

The distances between the connection points on the semiconductor chips, known in the art as "pitch", are becoming increasingly smaller. Today, in the Fine Pitch field, one already tends towards a pitch of only 50 μm. This means that the dimensions of the capillary in the area of its tip are also becoming increasingly smaller in order that the capillary does not come into contact with the already bonded wires. With the increasingly smaller dimensions of the tip of the capillary, the influence of unavoidable manufacturing tolerances on the mechanical characteristics of the capillary become greater. With bonding, the capillary wears out so that from time to time it has to be replaced by a new capillary. Today, in order to achieve reliable bonding results even in the Fine Pitch field without having to recalibrate the Wire Bonder with time consuming work after every capillary change, the capillaries are selected according to strict geometrical criteria.

SUMMARY OF THE INVENTION

The object of the invention is to develop a method for the calibration of a Wire Bonder which guarantees that, in mass production, semiconductor chips are wired under the same process conditions before and after a capillary change.

A further task which is set in mass production is the transfer of the optimum parameters found on one Wire Bonder to another Wire Bonder. The invention should also offer a solution for this task and support the recipe transfer from Wire Bonder to Wire Bonder in a simple and robust manner.

Each Wire Bonder has a capillary clamped to a horn. Ultrasonics is applied to the horn by an ultrasonic transducer, whereby the ultrasonic transducer is controlled by means of a parameter P. The parameter P is preferably the current which flows through the ultrasonic transducer. The parameter P can however also be the amplitude of the alternating voltage applied to the ultrasonic transducer or the power or another quantity which controls the ultrasonic transducer.

As a rule, on capillary change, the oscillating behaviour of the capillary tip changes because every capillary has somewhat different characteristics and is also slightly differently clamped onto the horn. The endeavoured aim of the named tasks consists in measuring the basic influential quantities of the capillary or the oscillation system formed by the horn and the capillary which have a fundamental influence on the bonding process and using the knowledge gained to reset the relevant bond parameters of the Wire Bonder after a capillary change according to the mechanical characteristics of the new capillary and only starting production with the new capillary after this.

The invention is based on the knowledge that the mechanical characteristics of the tip of the capillary have a strong influence on the ultrasonic force which the capillary exerts on the ball bond. Because the dimensions of the capillary in the area of its tip are becoming smaller and smaller, unavoidable manufacturing tolerances also cause increasing variations in the rigidity from capillary to capillary. The invention provides a solution as to how these variations in rigidity can be compensated.

During bonding, a predefined bond force is applied to the capillary. The tip of the capillary therefore presses in vertical direction against the ball bond which is clamped between the capillary and the connection point of the substrate. When ultrasonics is applied to the horn, then stationary ultrasonic waves are formed in the horn and in the capillary. Because the capillary is pressed against the ball bond, its tip can not oscillate freely. The tip of the capillary therefore exerts a force directed in horizontal direction, a so-called tangential force $F_T$, on the ball bond. This tangential force $F_T$ is a function of the deflection $A_H(t)$ of the tip of the horn in relation to the tip of the capillary, whereby the parameter t designates the time. The tangential force $F_T(t)$ is an alternating force $F_T(t)=F_{T0}*\cos(\omega t)$, which oscillates with the frequency $\omega$ of the ultrasonic waves.

The amplitude $A_H$ of the oscillation of the horn at the clamping point of the capillary relative to the tip of the capillary lies typically in the range of 0.1–4 μm and is therefore small in relation to the length of the capillary of typically 11 millimetres. The amplitude $A_H$ is also small in relation to the length of the thinnest part of the capillary, namely the tapering at the tip of the capillary. The capillary therefore behaves almost like a spring, ie, the amplitude $F_{T0}$ of the tangential force $F_T(t)$ is in good approximation proportional to the amplitude $A_H$ of the oscillations of the horn at the clamping point of the capillary relative to the tip of the capillary:

$$F_{T0}=k*A_H, \tag{1}$$

whereby the quantity k designates a constant which is dependent on the mechanical characteristics of the capillary: The constant k is a measure of the flexural strength of the capillary. The amplitude $F_{T0}$ of the tangential force is therefore fundamentally dependent on two quantities, namely the amplitude $A_H$, which is controlled by the ultrasonic transducer, and on the flexural strength of the capillary.

The solution of the named tasks now exists in determining the flexural strength for each capillary and, after each capillary change, adapting the parameter P, which controls the ultrasonic transducer, to the determined flexural strength of the capillary so that the tangential force exerted on the ball bond by the respective capillary is equally great before and after a capillary change.

When setting up for bonding a new product, the optimum values for various parameters such as bond force, parameter P for control of the ultrasonic transducer, etc, must first be determined. In the following, it is explained how the parameter P for control of the ultrasonic transducer is reset after a capillary change. The parameter P is, for example, the amplitude $I_0$ of the alternating current I which is applied to the ultrasonic transducer. A linear relationship exists between the amplitude $A_H$ and the amplitude $I_0$ of the alternating current: $A_H = \alpha * I_0$, whereby the quantity $\alpha$ is a Wire Bonder dependent constant which can be determined, for example, by means of a calibration in accordance with the method given in the European patent EP 498 936. Under the prerequisite that the clamping of the capillary in the horn has no or only little influence on the quantity $A_H$, the amplitude $F_{T0}$ of the tangential force therefore results in $$F_{T0} = k*A_H = k*\alpha*I_0. \tag{2}$$

Apart from influences of the clamping of the capillary in the horn, the amplitude of the tangential force $F_T$ produced by the Wire Bonder is therefore the same before and after a change from a first capillary, the flexural strength of which is characterised by the value $k_1$, to a second capillary, the flexural strength of which is characterised by the value $k_2$ when the Wire Bonder is operated after the capillary change with the value $$P_2 = I_{0,2} = k_1/k_2 * I_{0,1} = k_1/k_2 * P_1 \tag{3}$$

Because, with this correction, only the relationship $k_1/k_2$ is dealt with, it suffices when the flexural strength is not absolute but is only known as far as a proportional constant.

From the equation (1) it can be seen that, apart from the flexural strength of the respective capillary, the amplitude $A_H$ of the oscillations of the horn at the clamping point of the capillary relative to the tip of the capillary also influences the tangential force exerted on the ball bond. In order to also correct the influences of the clamping of the respective capillary on the horn as well as the distance L from the tip of the capillary to the clamping point on the horn which varies from clamp to clamp, the amplitude of the alternating current flowing through the ultrasonic transducer is preferably also corrected according to the amplitude $A_H$. In this case therefore, on the one hand, for the first capillary the flexural strength $k_1$ is determined and, on the other hand, the amplitude $A_{H1}$ of the oscillations of the horn is measured relative to the tip of the first capillary. Analogously, for the second capillary, the flexural strength $k_2$ and the corresponding amplitude $A_{H2}$ are determined. After the capillary change, parameter $P_2$ which is given by:

$$P_2 = I_{0,2} = k_1/k_2 * A_{H1}/A_{H2} * I_{0,1} = k_1/k_2 * A_{H1}/A_{H2} * P_1. \tag{4}$$

is then applied to the ultrasonic transducer. Measurement of the amplitude $A_H$ during the bonding process is relatively awkward because, during bonding, the ball bond starts relatively soon to slide back and forth on the connecting point. However, it has been shown that, instead of the amplitude $A_H$, the amplitude $A_C$ of the oscillations of the capillary in the area underneath the clamping point on the horn or the amplitude $A_S$ of the tip of the capillary can be used while the capillary oscillates freely in the air. For parameter $P_2$ one then gets:

$$P_2 = k_1/k_2 * A_{C1}/A_{C2} * P_1 \text{ or} \tag{5}$$

$$P_2 = k_1/k_2 * A_{S1}/A_{S2} * P_1, \tag{6}$$

whereby the quantities $A_{C1}$ and $A_{S1}$ designate the corresponding amplitudes before the capillary change and the quantities $A_{C2}$ and $A_{S2}$ designate the corresponding amplitudes after the capillary change. Of course it is important that the measurement of these amplitudes takes place with the capillary in the same position. Methods for measuring the amplitude of the freely oscillating capillary are known from the European patent EP 498 936 and from the Japanese patent application JP 10-209199. However, these documents assume that the oscillations of the capillary run parallel to the longitudinal direction of the horn. This is however not always the case: The amplitude of the oscillations of the capillary in a horizontal direction orthogonal to the longitudinal direction can amount to 30% of the amplitude of the oscillations of the capillary parallel to the longitudinal direction of the horn. With the measurement it must therefore be observed that the actual amplitude of the oscillations of the capillary is measured and not just a component of it.

When one of the amplitudes $A_{H1}$, $A_{C1}$ or $A_{S1}$ is measured as the amplitude $A(W_1)$, then the invention can also be used for recipe transfer from a first Wire Bonder $W_1$ to a second Wire Bonder $W_2$. The flexural strengths $k_1$ and $k_2$ of the used capillaries are determined as explained above. Furthermore, on the first Wire Bonder $W_1$ the amplitude $A(W_1)$ of the capillary is determined when a predefined value $P_0$ of the parameter P is applied to the ultrasonic transducer. The value $P(W_1)$ designates the value of the parameter P which is applied to the ultrasonic transducer of the first Wire Bonder $W_1$ with the setup bonding process. On the second Wire Bonder $W_2$ the corresponding amplitude $A_{H2}$, $A_{C2}$ or $A_{S2}$ is determined as amplitude $A(W_2)$ of the capillary when the value $P_0$ of the parameter P is applied to the ultrasonic transducer of the second Wire Bonder. The second Wire Bonder $W_2$ is then operated with the value $P(W_2)$ of the parameters P which is given by $P(W_2) = k_1/k_2 * A(W_1)/A(W_2) * P(W_1)$. The value $P(W_1)$ designates the value of the parameter P which is applied to the ultrasonic transducer of the first Wire Bonder $W_1$ with the setup bonding process.

It has now been shown that a further geometrical quantity exerts an influence on the tangential force, namely the diameter of the longitudinal drill hole of the capillary which guides the wire in the area of the tip. The longitudinal drill hole of the capillary has a constant diameter H in the lower area which widens out at the outlet for reasons which are irrelevant for the present invention. Because, on bonding, only that part of the ball bond located outside the longitudinal drill hole is deformed and not the part located inside, the portion of the deformed part of the ball bond reduces with increasing diameter H of the longitudinal drill hole. Therefore, after a capillary change, it is advantageous to apply the parameter $P_2$ which is given by:

$$P_2 = k_1/k_2 * A_1/A_2 * H_1^2/H_2^2 * P_1, \tag{7}$$

to the ultrasonic transducer whereby $k_1$ designates the flexural strength, $A_1$ one of the above-mentioned amplitudes $A_{H1}$, $A_{C1}$ or $A_{S1}$ of the freely oscillating capillary and $H_1$ the diameter of the longitudinal drill hole of the capillary before the capillary change and $k_2$, $A_2$ and $H_2$ the corresponding values of the capillary after the capillary change.

The correction factors explained above have proven themselves in practice. However, there are also cases where the correction factors have a more general dependency so that the parameter $P_2$ which, according to the model, is given by:

$$P_2 = g(k_1, k_2) * P_1 \qquad (8)$$

or $$P_2 = g(k_1, k_2, A_1, A_2) * P_1 \qquad (9),$$

or $$P_2 = g(k_1, k_2, A_1, A_2, H_1, H_2) * P_1 \qquad (10)$$

is applied to the ultrasonic transducer. In the following, different methods are explained based on the figures with which the flexural strength or an estimated value for the flexural strength is determined by means of a measurement or is determined mathematically based on individually measured geometrical data of the capillary and material parameters.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

Figure 2:
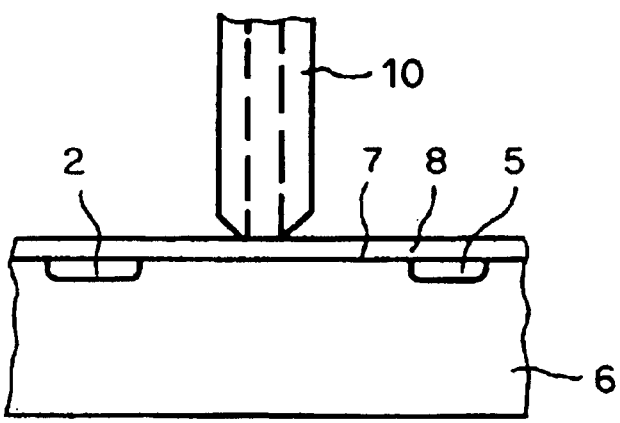
Figure 3:
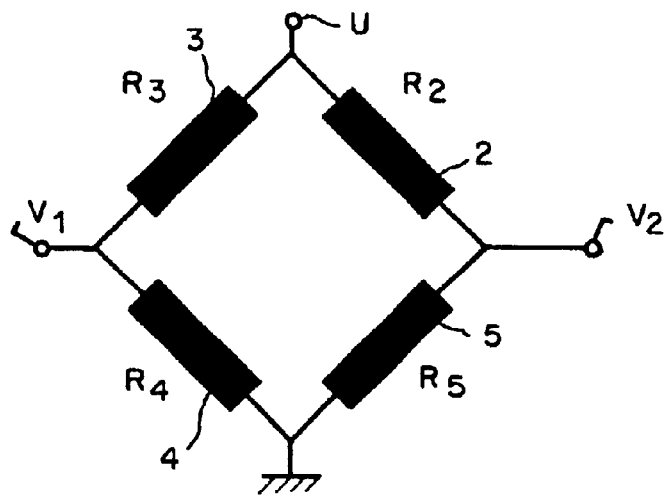
Figure 4:
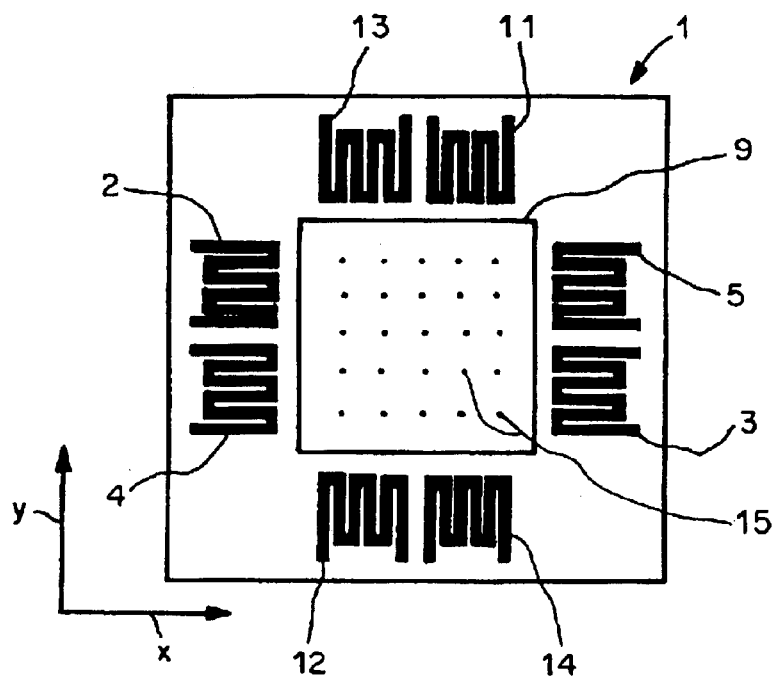
Figure 5:
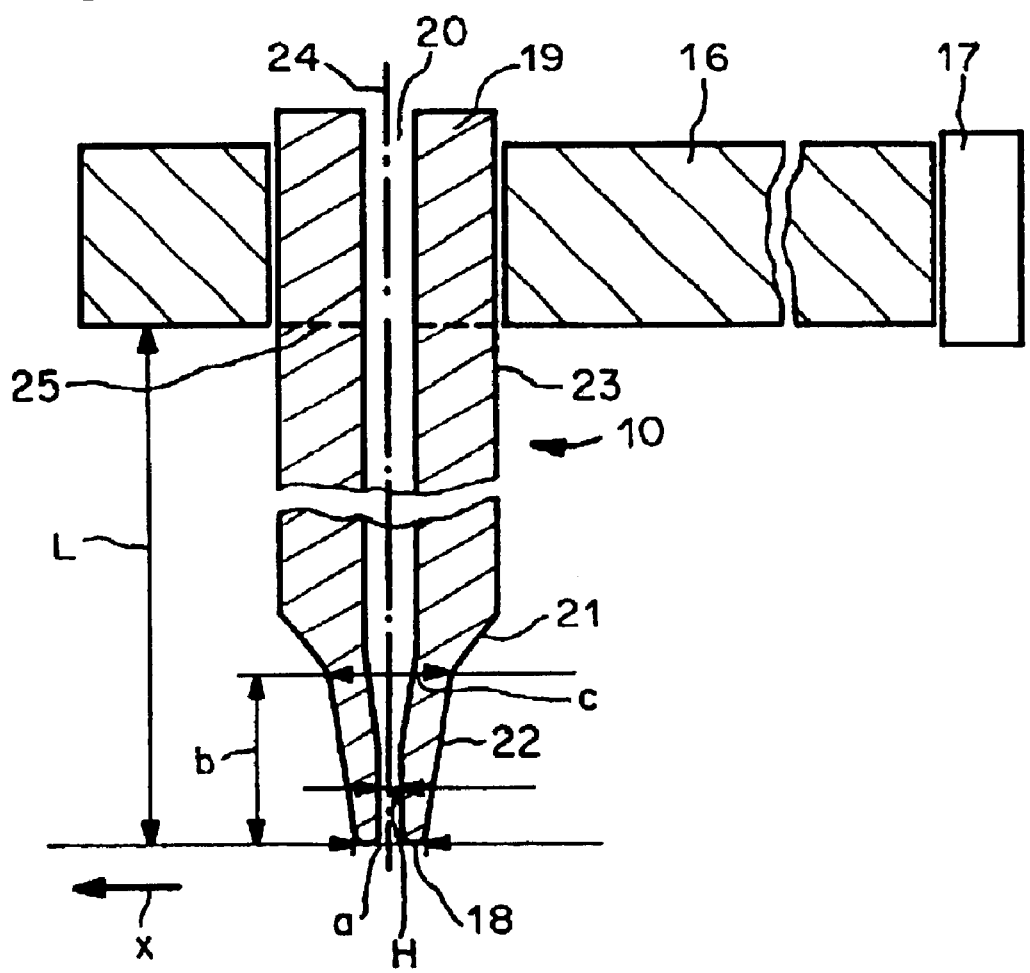

In the drawings:

FIGS. 1, 2 show a sensor integrated into a semiconductor chip which comprises four piezo-resistive elements, FIG. 3 shows the electrical circuitry of the four piezo-resistive elements, FIG. 4 shows a further piezo-resistive sensor, and FIG. 5 shows a cross-section of a capillary.

DESCRIPTION OF THE PREFERRED EMBODIMENTS

One possibility for determining the flexural strength by means of a measurement consists in measuring the tangential force produced by the capillary on application of ultrasonics with a piezo-resistive sensor. A piezo-resistive sensor suitable for this purpose is known from the article "Analysis of ultrasonic wire bonding by in-situ piezoresistive microsensors", which was published in the proceedings of the "Transducers '01 Eurosensors XV" conference from Jun. 10th–14th, 2001 in Munich.

FIGS. 1 and 2 show a plan view and a cross-section of a sensor 1 integrated into a semiconductor chip which comprises four piezo-resistive elements 2 to 5 which are electrically connected into a Wheatstone bridge. The output signal of the sensor 1 corresponds to the output signal of the Wheatstone bridge. The sensor 1 preferably comprises n-doped silicon 6 in one surface 7 of which the piezo-resistive elements 2 to 5 are embedded as square-wave shaped resistive paths of p-doped silicon. The surface 7 of the sensor 1 is covered with a customary passivation layer 8. The piezo-resistive elements 2 to 5 are arranged outside a, for example, square contact area 9 within which the tip of the capillary 10 of a Wire Bonder presses onto the semiconductor chip on calibration of the ultrasonic power. The area where the tip of the capillary 10 presses onto the sensor 1 in the ideal case, is presented by a broken circular ring 10'. In FIG. 1 the axes of a cartesian system of co-ordinates are marked with x and y. The x direction preferably runs parallel to one [110] axis of the silicon crystal. The square-wave shaped paths of the piezo-resistive elements 2 to 5 run in x direction and, as seen in x direction, are arranged to the left and right outside the contact area 9. They serve to detect the mechanical stresses, caused by the shear force $F_x$ which is induced by the capillary 10 in the sensor 1 in x direction on application of ultrasonics. For the measurement, the sensor 1 should be orientated in relation to the Wire Bonder so that the direction of oscillation of the capillary 10 runs as far as possible parallel to x direction.

FIG. 3 shows the electrical circuit diagram of the Wheatstone bridge formed by the four piezo-resistive elements 2 to 5. The four piezo-resistive elements 2 to 5 are wired up via normal printed conductors made of aluminium. The Wheatstone bridge is preferably supplied from a constant voltage source with a voltage U. The output voltage $U_{Out} = V_1 - V_2$ of the Wheatstone bridge then results in $$U_{Out} = \frac{R_2 R_4 - R_3 R_5}{(R_3 + R_4) * (R_2 + R_5)} U, \qquad (11)$$

whereby $R_2$ to $R_5$ designate the ohmic resistances of the piezo-resistive elements 2 to 5.

The flexural strength of the capillary is now determined by means of a Wire Bonder in accordance with the following method:

1. The capillary, without wire or without wire ball, is placed onto the contact area 9 of the sensor 1. The capillary should be placed as far as possible in the centre of the contact area 9.

2. A bond force $F_C$ which is large enough so that the capillary does not slide back and forth on the surface of the sensor 1 in the next step 3 is applied to the capillary. A bond force of 1N has proved to be efficient.

3. A predefined value of parameter P, for example the value used with the running production process, is applied to the ultrasonic transducer. One now has to wait until the initial response is completed and a stationary condition is achieved. This stationary condition is characterised in that the amplitude $U_0$ of the sensor signal $U_{Out}(t)$ no longer changes. The amplitude $U_0$ is saved as reference value $U_{Ref}$:

$$U_{Ref} = U_0 \qquad (12).$$

4. The capillary is raised from the sensor 1 and, while the capillary oscillates freely in the air, one of the previously described amplitudes $A_C$ or $A_S$ is determined as amplitude A.

5. The flexural strength k of the capillary is then calculated as $$k = U_{Ref}/A \qquad (13).$$

With this method therefore, it is assumed that the tangential force exerted by the capillary onto the ball bond is proportional to the shear force measured by the sensor 1. However, the value k determined with this method for the flexural strength of the capillary does not characterise the flexural strength of the capillary as an absolute value but only as a relative value, ie, as far as a proportional constant. One can also say that, instead of the precise value for the flexural strength, an estimated value is determined for the flexural strength. By the term estimated value is meant that not only is the value for the flexural strength not absolutely precise but also that the estimated value is only known as far as a proportional constant.

FIG. 4 shows a plan view of a sensor 1 with which a reference value $U_{Ref}$ can be determined without the sensor 1 having to be aligned relative to the direction of oscillation of the capillary. The sensor 1 contains four piezo-resistive elements 2 to 5 for measurement of the shear force $F_x$ induced in x direction, and four further piezo-resistive elements 11 to 14 for measurement of the shear force $F_y$ induced in y direction. The four piezo-resistive elements 2 to 5 are electrically connected as a first Wheatstone bridge the output signal of which is designated as $U_{Out,x}(t)$. The four piezo-resistive elements 11 to 14 are electrically connected as a second Wheatstone bridge the output signal of which is designated as $U_{Out,y}(t)$. With this sensor 1, a reference quantity $U_{Ref}$ can be determined without the direction of oscillation of the capillary 10 having to be aligned parallel to the x direction of the sensor 1. As soon as the initial response is completed and a stationary condition is achieved, the reference quantity $U_{Ref}$ is determined from the amplitudes $U_{0,x}$ and $U_{0,y}$ of the output signals $U_{Out,x}(t)$ and $U_{Out,y}(t)$ as $$U_{Ref} = \sqrt{U_{0,x}^2 + U_{0,y}^2}. \tag{14}$$

The dimensions of the contact area 9 amount typically to 80 µm·80 µm, while the diameter of the tip of the capillary 10 amounts to roughly 50 µm to 150 µm.

The amplitudes of the output signals $U_{Out,x}$ and $U_{Out,y}$ are dependent on the position where the capillary 10 presses onto the contact area 9. Therefore, in order to increase the accuracy of the calibration, it is suggested to place the capillary 10 on different locations on the contact area 9 and to determine the reference quantity $U_{Ref}$ and the correction factor γ based on the measured values acquired at these locations, eg, as follows:

In FIG. 4 the middle placement points 15 of the capillary 10 are shown schematically to each of which a pair of co-ordinates $(x_{i,k}, y_{i,k})$ is assigned, whereby the indices i and k in the example each accept five different values. The distance between two placement points 15 amounts typically to 5 µm to 10 µm. The amplitudes $U_{0,x}(x_{i,k}, y_{i,k})$ and, if necessary $U_{0,y}(x_{i,k}, y_{i,k})$, measured in accordance with one of the methods described above each form an area with a saddle. Now, the co-ordinates of the saddle $(x_{S,x}, y_{S,x})$ of the function $U_{0,x}$ and then the value $U_{0,x}(x_{S,x}, y_{S,x})$ as well as, if necessary, the co-ordinates of the saddle $(x_{S,y}, y_{S,y})$ of the function $U_{0,y}$ and then the value $U_{0,y}(x_{S,y}, y_{S,y})$ are determined mathematically and finally the reference value $U_{Ref}$ calculated according to equation (12) or (14).

A different possibility consists in measuring the geometrical data relevant for the flexural strength of the capillary and calculating the flexural strength or an estimated value for the flexural strength from these by means of a simulation programme under consideration of material parameters such as modulus of elasticity, density and damping coefficient for the internal friction of the capillary material at the ultrasonic frequency used for bonding. In the following, it is explained how an estimated value for the flexural strength of the capillary can be determined using the example of the capillary shown in FIG. 5.

FIG. 5 shows a cross-section of a capillary 10 which is clamped in a horn 16 of a Wire Bonder. Ultrasonics is applied to the horn 16 from an ultrasonic transducer 17. Generally, the ultrasonic transducer 17 consists of piezoelectric ceramics. The ultrasonic transducer 17 is preferably supplied with an alternating current $I=I_0 *\cos(\omega t)$ the frequency ω of which corresponds to the natural frequency of the oscillating system formed by the capillary and horn and the amplitude $I_0$ of which is adapted to the bonding process.

In the figure, L designates the distance of the tip 18 of the capillary from the clamping point on the horn which varies typically by up to 100 µm from clamp to clamp.

The capillary 10 comprises an oblong body 19 with a longitudinal drill hole 20 tapered towards the outlet for acceptance of a not presented bonding wire. The body 19 is tapered towards the tip 18 of the capillary 10 in one or, as presented, in two stages 21 and 22. The body 19 therefore comprises a shaft 23 and the two tapered stages 21 and 22. In the art, the second stage 22 is generally termed as the "bottle neck". The wall thickness of the capillary 10 is at its smallest in the area of the bottle neck which is why the fluctuations in the geometry of the capillary 10 in the area of the bottle neck naturally have the strongest effect on the flexural strength. It is so that variations in the outer dimensions have a much greater effect on the flexural strength than variations in the inner diameter of the longitudinal drill hole 20. A relatively good estimated value for the flexural strength of the capillary 10 can therefore already be is determined when only the outer dimensions of the bottle neck are taken into consideration. In addition, the assumption that the capillary 10 is rotationally symmetrical in relation to its longitudinal axis 24 in many cases proves to be justified and sufficiently accurate for determining the flexural strength.

In the example, it is assumed that the outer geometry of the bottle neck is rotationally symmetrical and trapezoidal. It is then characterised by means of the three lengths a, b and c. The three lengths a, b and c are determined with a suitable measuring method, eg optically. The geometry of the shaft 23 and the first tapering stage 21 are presumed as a constant as the influence of fluctuations in these two parts on the flexural strength in a good approximation is insignificant. The geometry of the longitudinal drill hole 20 is also presumed as a constant as its influence on the flexural strength is much less than the influence of the outer geometry.

The flexural strength $k_B$ is defined by means of the force F which is necessary in order to deflect the tip 18 of the capillary 10 by a predefined distance $x_0$ of typically 1 to 2 µm orthogonally to its longitudinal axis 24 in a direction designated as x direction:

$$F=-k_B *x_0.$$

The distance $x_0$ corresponds to the amplitude of the oscillations of the horn 16 at the clamping point of the capillary 10 relative to the tip of the capillary 10.

The flexural strength $k_B$ is determined under consideration of the material parameters of the capillary 10 such as modulus of elasticity E, density ρ and damping coefficient γ(ω) for the internal friction of the capillary material at the frequency of the ultrasonics used during bonding. This is done for example by means of a simulation programme working according to the method of finite elements which takes into consideration at least the outer geometry of the second tapering stage 22, ie of the bottle neck, in the example the second tapering stage 22 of the capillary assumed as being rotationally symmetrical and trapezoidal in cross-section, therefore the three geometrical parameters a, b and c, as well as the material parameters modulus of elasticity E, density ρ and damping coefficient γ(ω). The geometry of the longitudinal drill hole 20 is presumed as a constant. The geometry of its outlet at the tip 18 of the capillary 20 is either considered as a constant or measured individually for each capillary 10 and taken into consideration for the simulation.

On determining the estimated value k with the aid of the simulation programme, the geometry of the first tapering stage 21 and the shaft 23 are also preferably taken into consideration, however, as a rule, these geometries can be presumed as constants as these parts are much more rigid than the second tapering stage 22. The value for the flexural strength $k_B$ determined in this way does not represent the actual flexural strength but an estimated value k.

For the simulation, a dynamic model is preferably used with which the border edge 25 is stimulated to oscillations in x direction. Furthermore, a torque induced by means of the deflection of the border edge 25 is preferably also taken into consideration. It is however also possible to use a static model with which the border edge 25 is deflected in x direction by a distance of typically 2 μm in x direction. With the dynamic as well as the static model the force directed in x direction at the tip 18 of the capillary is calculated. The simulation therefore takes into consideration the mechanical characteristics of the capillary from its tip up to the clamping point on the horn 16 represented by the border edge 25.

Capillaries with a different geometry are also available on the market. In this case, for the mathematical determining of the flexural strength by means of a simulation programme, the geometry of the tip of the capillary must be described by means of suitable parameters and these measured for the simulation for each capillary.

From FIG. 5 it can also be seen that, in the lower area of the second tapering stage 22, the longitudinal drill hole 20 of the capillary 10 has a constant diameter H which widens out at the outlet for reasons which are irrelevant for the present invention. When the diameter H is individually determined for each capillary, the ultrasonic parameter P can be adapted after a capillary change according to equation (7) as explained above.

What is claimed is:

1. Method for the calibration of a Wire Bonder after a change from a first capillary to a second capillary, whereby the first or second capillary is clamped onto the tip of a horn to which ultrasonics can be applied from an ultrasonic transducer, whereby on operation with the first capillary the ultrasonic transducer is controlled with a value $P_1$ of a parameter P and whereby on operation with the second capillary the ultrasonic transducer is controlled with a value $P_2$ of the parameter P, wherein an estimated value $k_1$ is determined for the flexural strength of the first capillary and an estimated value $k_2$ is determined for the flexural strength of the second capillary, and wherein the value $P_2$ is set to $P_2 = g(k_1, k_2)*P_1$, whereby $g(k_1, k_2)$ is a predetermined function of the two estimated values $k_1$ and $k_2$.

2. Method according to claim 1, wherein the function $g(k_1, k_2)$ is given by $g(k_1, k_2) = k_1/k_2$.

3. Method according to claim 1, wherein at least the outer geometry of the tip of the respective capillary is measured for determining the estimated values $k_1$ and $k_2$.

4. Method according to claim 2, wherein at least the outer geometry of the tip of the respective capillary is measured for determining the estimated values $k_1$ and $k_2$.

5. Method according to claim 1, wherein the estimated values $k_1$ and $k_2$ are determined with the aid of a piezoresistive sensor.

6. Method according to claim 2, wherein the estimated values $k_1$ and $k_2$ are determined with the aid of a piezoresistive sensor.

7. Method for the calibration of a Wire Bonder after a change from a first capillary to a second capillary, whereby the first or second capillary is clamped onto the tip of a horn to which ultrasonics can be applied from an ultrasonic transducer, whereby on operation with the first capillary the ultrasonic transducer is controlled with a value $P_1$ of a parameter P and whereby on operation with the second capillary the ultrasonic transducer is controlled with a value $P_2$ of the parameter P, wherein an estimated value $k_1$ is determined for the flexural strength of the first capillary and an estimated value $k_2$ is determined for the flexural strength of the second capillary, wherein the amplitude $A_1$ of the oscillations of the tip of the first capillary is determined when a predetermined value $P_0$ of the parameter P is applied to the ultrasonic transducer, wherein the amplitude $A_2$ of the oscillations of the tip of the second capillary is determined when the predetermined value $P_0$ of the parameter P is applied to the ultrasonic transducer, and wherein the value $P_2$ is set to $P_2 = g(k_1, k_2, A_1, A_2)*P_1$, whereby $g(k_1, k_2, A_1, A_2)$ is a predetermined function of the two estimated values $k_1$ and $k_2$ and the measured amplitudes $A_1$ and $A_2$.

8. Method according to claim 7, wherein the function $g(k_1, k_2, A_1, A_2)$ is given by $g(k_1, k_2, A_1, A_2) = k_1/k_2 * A_1/A_2$.

9. Method according to claim 7, wherein at least the outer geometry of the tip of the respective capillary is measured for determining the estimated values $k_1$ and $k_2$.

10. Method according to claim 8, wherein at least the outer geometry of the tip of the respective capillary is measured for determining the estimated values $k_1$ and $k_2$.

11. Method according to claim 7, wherein the estimated values $k_1$ and $k_2$ are determined with the aid of a piezoresistive sensor.

12. Method according to claim 8, wherein the estimated values $k_1$ and $k_2$ are determined with the aid of a piezoresistive sensor.

13. Method for the calibration of a Wire Bonder after a change from a first capillary to a second capillary, whereby the first or second capillary is clamped onto the tip of a horn to which ultrasonics can be applied from an ultrasonic transducer, whereby on operation with the first capillary the ultrasonic transducer is controlled with a value $P_1$ of a parameter P and whereby on operation with the second capillary the ultrasonic transducer is controlled with a value $P_2$ of the parameter P, and whereby the first and second capillary have a longitudinal drill hole the side of which facing towards the outlet has a constant diameter $H_1$ or $H_2$ over a certain distance, wherein an estimated value $k_1$ is determined for the flexural strength of the first capillary and an estimated value $k_2$ is determined for the flexural strength of the second capillary, wherein the amplitude $A_1$ of the oscillations of the tip of the first capillary is determined when a predetermined value $P_0$ of the parameter P is applied to the ultrasonic transducer, wherein the amplitude $A_2$ of the oscillations of the tip of the second capillary is determined when the predetermined value $P_0$ of the parameter P is applied to the ultrasonic transducer, wherein a diameter $H_1$ of the first capillary and a diameter $H_2$ of the second capillary are measured, and wherein the value $P_2$ is set to $P_2 = g(k_1, k_2, A_1, A_2, H_1, H_2)*P_1$, whereby $g(k_1, k_2, A_1, A_2, H_1, H_2)$ is a predetermined function of the two estimated values $k_1$ and $k_2$, the measured amplitudes $A_1$ and $A_2$ and the measured diameters $H_1$ and $H_2$.

14. Method according to claim 13, wherein the function $g(k_1, k_2, A_1, A_2, H_1, H_2)$ is given by $g(k_1, k_2, A_1, A_2, H_1, H_2) = k_1/k_2 * A_1/A_2 * H_1^2/H_2^2$.

15. Method according to claim 13, wherein at least the outer geometry of the tip of the respective capillary is measured for determining the estimated values $k_1$ and $k_2$.

16. Method according to claim 14, wherein at least the outer geometry of the tip of the respective capillary is measured for determining the estimated values $k_1$ and $k_2$.

17. Method according to claim 13, wherein the estimated values $k_1$ and $k_2$ are determined with the aid of a piezoresistive sensor.

18. Method according to claim 14, wherein the estimated values $k_1$ and $k_2$ are determined with the aid of a piezoresistive sensor.

* * * * *